(12) United States Patent
Villardier et al.

(10) Patent No.: US 11,616,319 B2
(45) Date of Patent: Mar. 28, 2023

(54) PROTECTIVE COVER FOR A TERMINAL BLOCK ASSEMBLY

(71) Applicant: Tyco Electronics France SAS, Pontoise (FR)

(72) Inventors: Yannick Villardier, Pontoise (FR); Romain Villard, Pontoise (FR)

(73) Assignee: Tyco Electronics France SAS, Pontoise (FR)

( * ) Notice: Subject to any disclaimer, the term of this patent is extended or adjusted under 35 U.S.C. 154(b) by 19 days.

(21) Appl. No.: 17/148,061

(22) Filed: Jan. 13, 2021

(65) Prior Publication Data

US 2021/0218178 A1    Jul. 15, 2021

(30) Foreign Application Priority Data

Jan. 14, 2020   (EP) ..................................... 20305022

(51) Int. Cl.
*H05K 5/03*    (2006.01)
*H01R 13/447*  (2006.01)

(52) U.S. Cl.
CPC ............. *H01R 13/447* (2013.01); *H05K 5/03* (2013.01)

(58) Field of Classification Search
CPC ................ H01R 13/447; H01R 13/516; H01R 13/5213; H05K 5/03
See application file for complete search history.

(56) References Cited

U.S. PATENT DOCUMENTS

| | | | | |
|---|---|---|---|---|
| 6,162,087 A * | 12/2000 | Hiura | ................. | H01R 13/5213 174/152 G |
| 8,727,818 B2 * | 5/2014 | Kossak | ................ | H01R 13/447 439/798 |
| 9,601,865 B2 * | 3/2017 | Berengut | ........... | H01R 13/5213 |
| 2012/0088394 A1 | 4/2012 | Dreier et al. | | |

FOREIGN PATENT DOCUMENTS

| | | |
|---|---|---|
| DE | 28 49 077 A1 | 5/1980 |
| DE | 20 2010 014149 U1 | 1/2012 |
| EP | 0872915 A2 | 10/1998 |
| EP | 0 940 883 A1 | 9/1999 |
| EP | 1 020 959 A2 | 7/2000 |
| GB | 2 292 642 A | 2/1996 |

OTHER PUBLICATIONS

European Search Report and Written Opinion, dated Jun. 29, 2020, 10 pages.
Abstract of DE 2849077, dated May 14, 1980, 1 page.
Abstract of EP 1020959, dated Jul. 19, 2020, 2 pages.

* cited by examiner

*Primary Examiner* — Vanessa Girardi
(74) *Attorney, Agent, or Firm* — Barley Snyder

(57) ABSTRACT

A safety electrical assembly includes an electrical apparatus having a connecting zone with a plurality of terminals each connected to a cable, each of the terminals having a connecting opening formed within an insulating housing of the electrical apparatus, a protective cover cooperating with the electrical apparatus in a mounted position, and a main opening for the cables connected to the terminals extending from an exterior area to an interior area of the safety electrical assembly. The interior area is defined between the electrical apparatus and the protective cover. The connecting openings are disposed in the interior area. The main opening is arranged so that a direct trajectory from any point of the main opening oriented toward any point of any connecting opening intersects an obstacle of the safety electrical assembly.

17 Claims, 3 Drawing Sheets

PROTECTIVE COVER FOR A TERMINAL BLOCK ASSEMBLY

CROSS-REFERENCE TO RELATED APPLICATION

This application claims the benefit of the filing date under 35 U.S.C. § 119(a)-(d) of European Patent Application No. 20305022, filed on Jan. 14, 2020.

FIELD OF THE INVENTION

The present invention relates to a safety electrical assembly and, more particularly, to a safety electrical assembly with a protective cover having a main opening.

BACKGROUND

A safety electrical assembly commonly includes an electrical apparatus and a protective cover to prevent access to terminals located on the electrical apparatus. Such an electrical apparatus, for example, can include a row of terminal blocks. A protective cover can be mounted on this row of terminal blocks to manage the cables connected to corresponding terminals of the terminal blocks. The protective cover may have several dedicated pre-cut portions that can become individual openings for corresponding cables. Several dimensions of pre-cut portions can exist to enable the passage of different sized cables. This provision enables a protection of the user, as the terminals are not accessible by hand or with a tool such as a screwdriver.

Cable management, however, could become an issue in such an arrangement, as it is time consuming to remove the pre-cut portions where necessary. The installation of each cable in the corresponding opening can therefore be difficult. In addition, the protective cover should have the precise amount of pre-cut openings corresponding to the electrical apparatus, which means that several protective cover models are necessary if a different number or size of cables are needed.

SUMMARY

A safety electrical assembly includes an electrical apparatus having a connecting zone with a plurality of terminals each connected to a cable, each of the terminals having a connecting opening formed within an insulating housing of the electrical apparatus, a protective cover cooperating with the electrical apparatus in a mounted position, and a main opening for the cables connected to the terminals extending from an exterior area to an interior area of the safety electrical assembly. The interior area is defined between the electrical apparatus and the protective cover. The connecting openings are disposed in the interior area. The main opening is arranged so that a direct trajectory from any point of the main opening oriented toward any point of any connecting opening intersects an obstacle of the safety electrical assembly.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
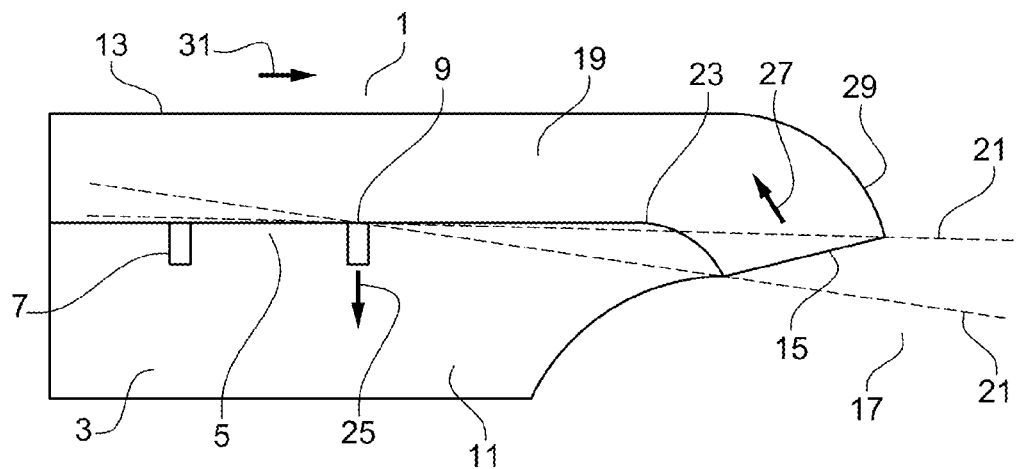
FIG. 1 is a sectional side view of a safety electrical assembly according to an embodiment.

In the following, exemplary embodiments of the invention are described with reference to the drawings. The shown and described embodiments are for explanatory purposes only. The combination of features shown in the embodiments may be changed according to the description. For example, a feature which is not shown in an embodiment but described may be added if the technical effect associated with this feature is beneficial for a particular application. Vice versa, a feature shown as part of an embodiment may be omitted if the technical effect associated with this feature is not needed in a particular application. In the drawings, elements that correspond to each other with respect to function and/or structure have been provided with the same reference numeral.

Figure 2:
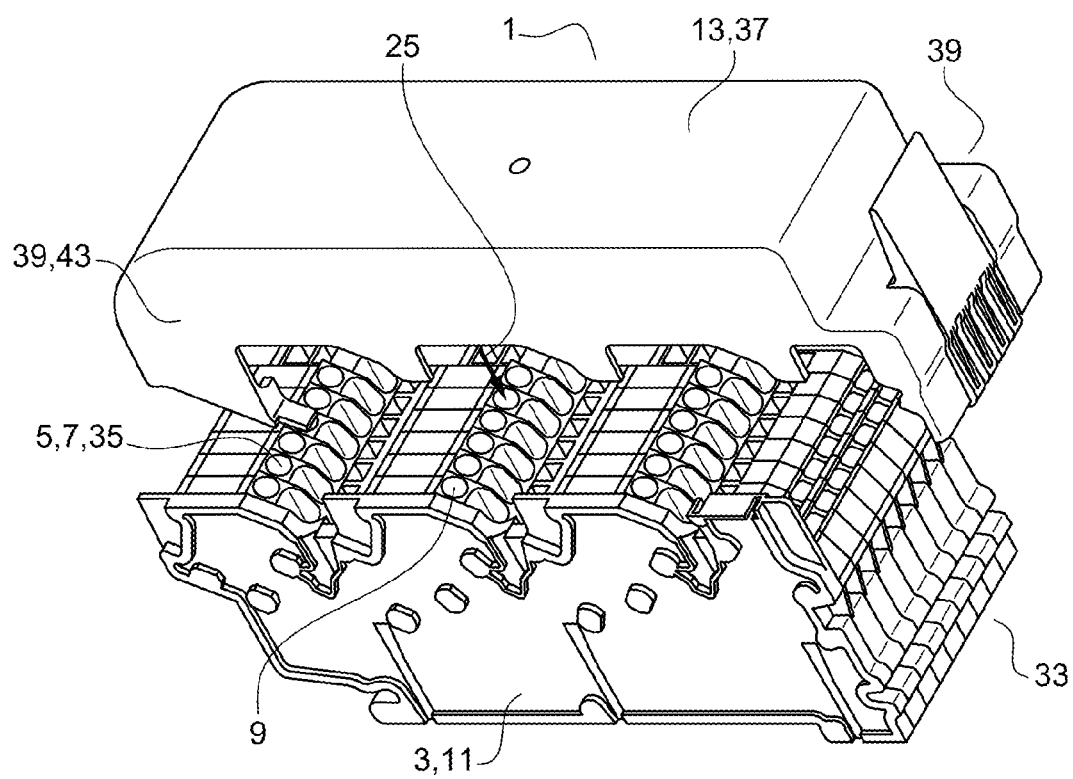
FIG. 2 is a top perspective view of the safety electrical assembly.

A safety electrical assembly 1 according to an embodiment, as shown in FIGS. 1 and 2, comprises an electrical apparatus 3 having a connecting zone 5 provided with a plurality of terminals 7 configured to be respectively connected to corresponding cables, each terminal 7 presenting a corresponding connecting opening 9 formed within an insulating housing 11 of the electrical apparatus 3.

The safety electrical assembly 1 has a protective cover 13, as shown in FIGS. 1 to 6, configured for cooperating with the electrical apparatus 3 in a mounted position. The safety electrical assembly 1 presents a main opening 15 configured for the passage of cables connected to corresponding terminals 7 from an exterior area 17 to an interior area 19 of the safety electrical assembly 1.

The interior area 19 is defined between the electrical apparatus 3 and the protective cover 13, as shown in FIG. 1. The connecting openings 9 are located in the interior area 19 and the main opening 15 is arranged so that a direct trajectory 21 from any point of the main opening 15 oriented toward any point of any connecting opening 9 intersects an obstacle 23 of the safety electrical assembly 1. In other words, a direct trajectory 21 is a straight line. An obstacle 23 is a physical element from the safety electrical assembly 1 that is intersected by the straight line. Any point of the main opening 15 is to be considered as any point comprised within an area defined by a contour of the main opening 15. Any point of a connecting opening 9 is to be considered as any point comprised within an area defined by a contour of the connecting opening 9.

Figure 3:
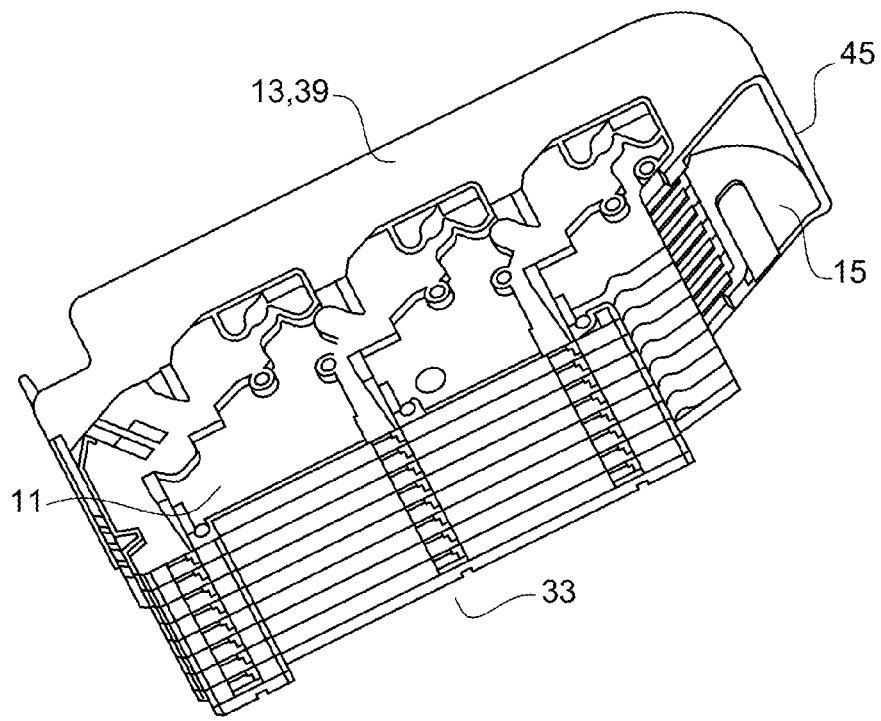
FIG. 3 is a bottom perspective view of the safety electrical assembly.

In an embodiment, as shown in FIGS. 1 and 3, the main opening 15 is the only opening between the interior area 19 and the exterior area 17 configured for the passage of at least one cable to be connected to at least a corresponding terminal 7 of the connecting zone 5.

The main opening 15 is oriented parallel to or obliquely to each connecting opening 9, an insertion direction 25 in the terminals 7 shown in FIG. 1 being opposed to an inlet direction 27 defined by an inlet channel 29 formed from the main opening 15 and oriented towards the interior area 19. In other words, the inlet channel 29 corresponds to a channel formed by the safety electrical assembly 1, in particular by the insulating housing 11 and the protective cover 13, and starting from the main opening 15. The inlet direction 27 corresponds to a general flow direction aligned with the walls of the safety electrical assembly 1 constituting the inlet channel 29. This allows the main opening 15 to be bigger, and in particular have a bigger order of magnitude, than individual connecting openings 9. At the same time, the connecting openings 9 are protected.

The safety electrical assembly 1 is configured to extend according to a longitudinal direction 31 shown in FIG. 1, a part of the protective cover 13 contiguous to the main opening 15 extending farther than the insulating housing 11 of the electrical apparatus 3 according to the longitudinal direction 31. This geometrical feature defines the position of the main opening 15 that enables the insulating housing 11 to constitute the obstacle 23 in the mounted position.

Figure 4:
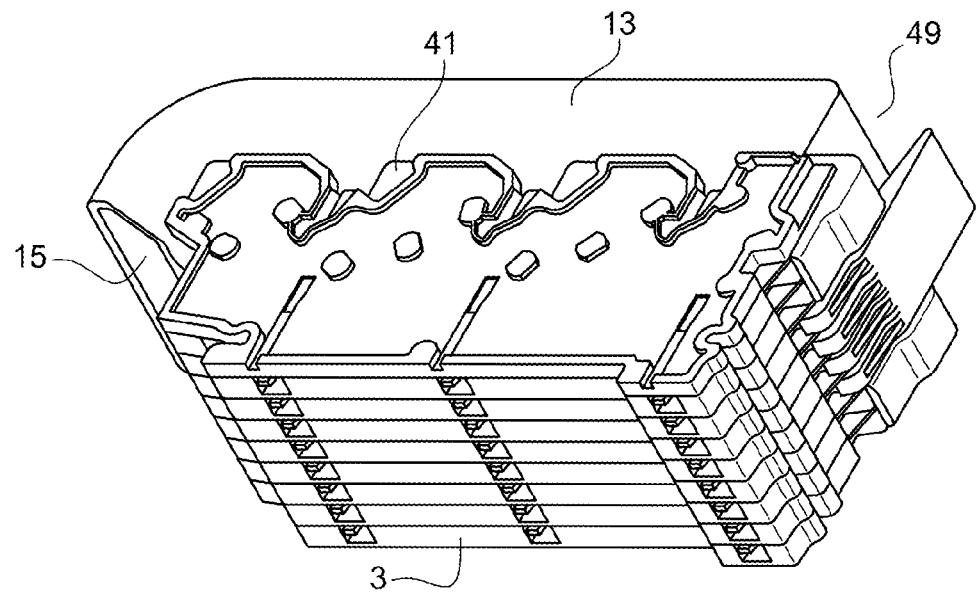
FIG. 4 is a bottom perspective view of the safety electrical assembly in a mounted position.

As shown in FIGS. 2 to 4, the electrical apparatus 3 comprises a row of terminal blocks 33, each terminal block 33 has an upper side 35, the connecting zone 5 being located on the upper sides 35 of the terminal blocks 33. The terminal blocks 33 can be linked to different sized cables as all the cables can pass through the main opening 15.

The protective cover 13, as shown in FIG. 2, has an upper wall 37 located in front of the connecting zone 5, the connecting openings 9 being oriented transversely to the upper wall 37. In other words, the orientation of a connecting opening 9 is to be understood as the insertion direction 25 of the cable in the connecting opening 9. Thus, all the cables connected to the electrical apparatus 3 have a similar orientation with regard to the upper wall 37.

At least one group of connecting openings 9 present a tilted orientation with regard to another group of connecting openings 9. Consequently, some of the cables are tilted with regard to others when exiting the connecting zone 5. This particularly applies when the electrical apparatus 3 is a row of terminal blocks 33 as in the embodiment shown in FIG. 2. According to an aspect of the invention, the at least one group of connecting openings 9 with the tilted orientation are inclined with an angle comprised between 20° and 50°, between 25° and 35°, or with an angle of 30° with regard to the other group.

According to one aspect of the invention, the connecting openings 9 of the other group are oriented substantially perpendicularly to the longitudinal direction. In an embodiment, connecting openings 9 oriented perpendicularly are push-in openings. Tilted connecting openings 9 are screwed typed openings. In another embodiment, all the connecting openings 9 are substantially perpendicular to the longitudinal direction. In that case, all the connecting openings 9 are push-in openings.

The protective cover 13 has a pair of transverse walls 39 that are linked to and extending transversely from the upper wall 37, as shown in FIGS. 2 and 3, at least some of the transverse walls 39 are configured to cooperate with the insulating housing 11 in a mounted position.

The transverse walls 39 are arranged in a mounted position to define the main opening 15.

The transverse walls 39, as shown in FIGS. 2 and 3, have a pair of opposed side walls 43 and a front wall 45 linked to the two side walls 43, the side walls 43 and the front wall 45 defining the main opening 15. A linking region 47 between the upper wall 37 and the front wall 45 presents a curved form, as shown in FIG. 5.

Figure 5:
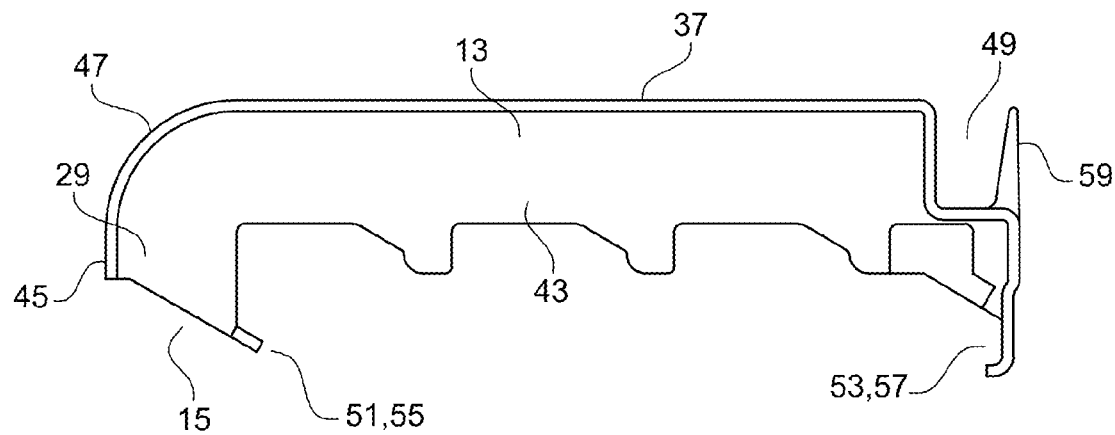
FIG. 5 is a side view of a protective cover of the safety electrical assembly.
Figure 6:
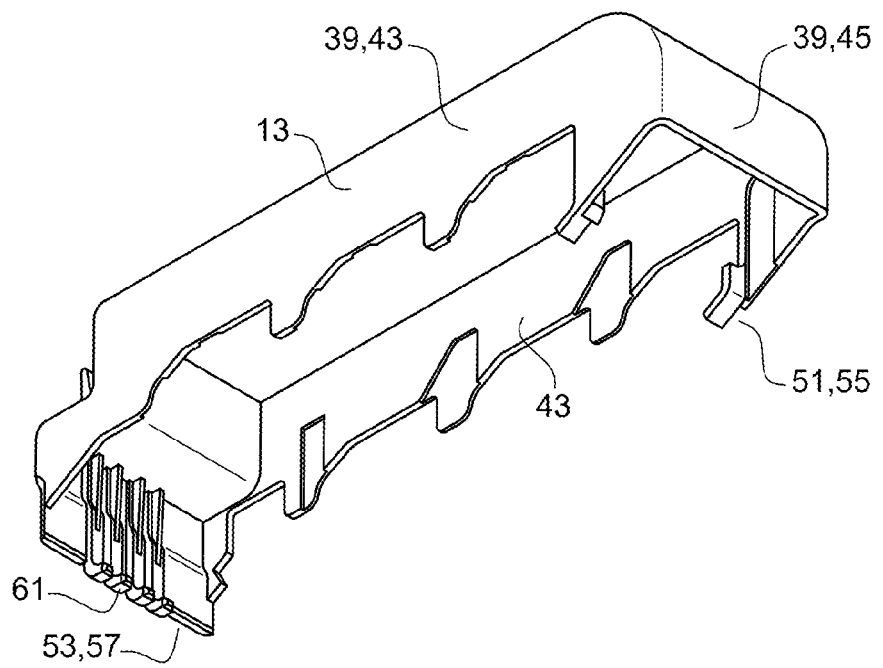
FIG. 6 is a perspective view of the protective cover.

As shown in FIGS. 4 to 6, the transverse walls 39 have a rear wall 49 transverse to and linking the two side walls 43, the side walls 43 being attached to a first part of a fastening mechanism 51 of the safety electrical assembly 1 configured for cooperating with the insulating housing 11 and the rear wall 49 being attached to a second part of the fastening mechanism 53. The first part of the fastening mechanism 51 has at least one first fastening element 55 and the second part of the fastening mechanism 53 has at least one second fastening element 57, the at least one first fastening element 55 and the at least one second fastening element 57 being oriented toward each other. The second part of the fastening mechanism 55 has a release lever 59 configured to displace the first part of the fastening mechanism 51 with regard to the second part of the fastening mechanism 53 to dismount the protective cover 13.

When the electrical apparatus 3 is a row of terminal blocks 33, the second part of the fastening mechanism 53 has an indexed form 61 configured to cooperate with several rear portions of aligned terminal blocks 33, as shown in FIG. 6.

The protective cover 13 is at least partially transparent in an embodiment. This enables a visual control of the interior area by a user without dismounting the protective cover 13. The protective cover 13 is made of a non-conductive material, and is made of a plastic in an embodiment.

The safety electrical assembly 1 according to the embodiments described herein has an effective cover 13 that prevents access to the connecting openings 9 of the terminals 7, the cover 13 being defined by a simple design as one opening, the main opening 15, allows the passage of cables connected to corresponding terminals 7. Requirements of norm IP4x are in addition fulfilled. The main opening 15 that enables the passage of several cables does not limit the diameter of the cables as the main opening 15 is configured for a certain amount of cables depending on its section. This is to compare with a cover that have several individual openings, each dedicated to a cables size. The cable management becomes simple and enables mounting of several cables on the connecting zone 5 and then setting the cover 13 in mounted position by manually maintaining the cables together. The size of each cable is also not limited by a restrained passage. Moreover, the simple design simplifies its fabrication.

The invention is not limited to the embodiments described above by way of example and encompasses all the variants.

What is claimed is:

1. A safety electrical assembly, comprising:
an electrical apparatus having a connecting zone with a plurality of terminals each being connectable to a cable, each of the terminals having a connecting opening formed within an insulating housing of the electrical apparatus;
a protective cover cooperating with the electrical apparatus in a mounted position; and a main opening for cables being connectable to the terminals extending from an exterior area to an interior area of the safety electrical assembly, the interior area defined between the electrical apparatus and the protective cover, the connecting opening disposed in the interior area and facing away from the main opening, the main opening arranged so that a direct trajectory from any point of the main opening oriented toward any point of any connecting opening intersects an obstacle of the safety electrical assembly.

2. The safety electrical assembly of claim 1, wherein the main opening is the only opening between the interior area and the exterior area configured for passage of at least one cable to be connected to at least one of the terminals of the connecting zone.

3. The safety electrical assembly of claim 1, wherein a part of the protective cover contiguous to the main opening extends further in a longitudinal direction than the insulating housing.

4. The safety electrical assembly of claim 1, wherein the protective cover is at least partially transparent.

5. The safety electrical assembly of claim 1, wherein the main opening is oriented parallel to or obliquely to each connecting opening.

6. The safety electrical assembly of claim 5, wherein an insertion direction of the terminals is opposed to an inlet direction defined by an inlet channel formed from the main opening and oriented toward the interior area.

7. The safety electrical assembly of claim 1, wherein the electrical apparatus includes a row of terminal blocks.

8. The safety electrical assembly of claim 7, wherein each of the terminal blocks has an upper side, the connecting zone is located on the upper sides of the terminal blocks.

9. The safety electrical assembly of claim 1, wherein the protective cover has an upper wall located in front of the connecting zone.

10. The safety electrical assembly of claim 9, wherein the connecting openings are oriented transversely to the upper wall.

11. The safety electrical assembly of claim 10, wherein at least one group of connecting openings has a tilted orientation with regard to another group of connecting openings.

12. The safety electrical assembly of claim 9, wherein the protective cover has a pair of transverse walls that are linked to an extend transversely from the upper wall.

13. The safety electrical assembly of claim 12, wherein at least some of the transverse walls of the protective cover cooperate with the insulating housing in the mounted position.

14. The safety electrical assembly of claim 13, wherein the transverse walls of the protective cover include a pair of opposed side walls and a front connected to the pair of opposed side walls, the pair of opposed side walls and the front wall define the main opening.

15. The safety electrical assembly of claim 14, wherein the transverse walls of the protective cover include a rear wall transverse to and connecting the pair of opposed side walls.

16. The safety electrical assembly of claim 15, wherein the pair of opposed side walls are attached to a first part of a fastening mechanism of the safety electrical assembly, the first part of the fastening mechanism cooperates with the insulating housing.

17. The safety electrical assembly of claim 16, wherein the rear wall is attached to a second part of the fastening mechanism.

\* \* \* \* \*